(12) United States Patent
Kilgore

(10) Patent No.: US 7,144,822 B1
(45) Date of Patent: Dec. 5, 2006

(54) HIGH DENSITY PLASMA PROCESS FOR OPTIMUM FILM QUALITY AND ELECTRICAL RESULTS

(75) Inventor: Michael D. Kilgore, Santa Clara, CA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 10/072,357

(22) Filed: Feb. 6, 2002

(51) Int. Cl.
H01L 21/469 (2006.01)
H01L 21/31 (2006.01)
H01L 21/4763 (2006.01)

(52) U.S. Cl. .............. 438/758; 438/624; 438/778; 438/788; 438/792

(58) Field of Classification Search ........... 438/624, 438/758, 763, 778, 782, 784, 787, 788, 792; 427/573, 579; 118/715
See application file for complete search history.

(56) References Cited

U.S. PATENT DOCUMENTS

| 5,132,244 A * | 7/1992 | Roy ................... 438/477 |
| 5,221,414 A * | 6/1993 | Langley et al. ........... 216/74 |
| 5,436,172 A * | 7/1995 | Moslehi ................. 374/121 |
| 5,673,750 A * | 10/1997 | Tsubone et al. ........... 165/275 |
| 5,736,423 A * | 4/1998 | Ngo ..................... 438/787 |
| 5,834,068 A * | 11/1998 | Chern et al. ............. 427/535 |
| 5,851,892 A * | 12/1998 | Lojek et al. ............. 438/305 |
| 5,882,417 A | 3/1999 | Van de Ven et al. ....... 118/728 |
| 5,925,212 A * | 7/1999 | Rice et al. .............. 156/345.27 |
| 5,937,323 A * | 8/1999 | Orczyk et al. ........... 438/624 |
| 6,028,324 A | 2/2000 | Su et al. ................. 257/48 |
| 6,054,206 A | 4/2000 | Mountsier .............. 428/312.8 |
| 6,143,579 A | 11/2000 | Chang et al. ............. 438/17 |
| 6,222,228 B1 | 4/2001 | Malone et al. ........... 257/327 |
| 6,268,274 B1 * | 7/2001 | Wang et al. ............. 438/597 |
| 6,335,288 B1 * | 1/2002 | Kwan et al. ............. 438/694 |
| 6,403,501 B1 * | 6/2002 | Hander et al. ........... 438/783 |
| 6,524,955 B1 * | 2/2003 | Fukuda et al. ........... 438/680 |
| 6,551,946 B1 * | 4/2003 | Chen et al. .............. 438/770 |
| 6,660,662 B1 * | 12/2003 | Ishikawa et al. ......... 438/787 |
| 6,858,265 B1 * | 2/2005 | Redeker et al. .......... 427/569 |

OTHER PUBLICATIONS

Li et al. "Gate Oxide Damage Reduction and Antenna Yield Improvement Using Low temperature Preclean for Sub-o.25 microns Metallization", Jun. 1999, IEEE, pp. 134-136.*

* cited by examiner

Primary Examiner—Maria F. Guerrero
(74) Attorney, Agent, or Firm—Silicon Valley Patent Group LLP

(57) ABSTRACT

A method for plasma processing of semiconductor wafers is provided that reduces plasma-induced damage to the gate dielectric while limiting damage to the wafer from particulates that flake off of the interior surfaces of the reaction chamber. Plasma conditions are maintained in the reaction chamber while the wafer is transferred into the chamber and the plasma process is performed. After the plasma process, while still maintaining plasma conditions, the wafer is cooled to a removal temperature and removed from the reaction chamber.

19 Claims, 1 Drawing Sheet

HIGH DENSITY PLASMA PROCESS FOR OPTIMUM FILM QUALITY AND ELECTRICAL RESULTS

BACKGROUND OF THE INVENTION

1. Field of the Invention

The embodiments of the invention relate to integrated circuit fabrication and, in particular, to reducing plasma process induced damage to the gate dielectric.

2. Description of the Background

In the fabrication of integrated circuit devices, the gate dielectric can be damaged by exposure to a plasma used in processing steps that are performed on the device after the gate dielectric layer is formed. This plasma process induced damage, also known as plasma-charging damage, to the gate dielectric can degrade device performance and reduce yields. Processes that may cause damage to the gate dielectric include plasma etching of the polysilicon gate material to complete the transistors and plasma deposition and etching of metal and insulator layers used to form electrical connections between the transistors.

The exact mechanisms of plasma-induced damage are not completely understood, but it is known that the plasma can create an electrical potential across the gate dielectric that causes electrical current to flow through the gate. The current can damage or even destroy the gate dielectric. The degree of damage depends, in part, on the design of the device. It is believed that in many cases the electrical potential across the gate dielectric is created by the accumulation of charges from the plasma on exposed areas of metal or conductive polysilicons, which act as antennas. A high antenna-to-gate dielectric ratio causes more current to flow through the gate dielectric, and hence results in more damage. Thus, larger areas of metals or conductive polysilicons can result in more gate dielectric damage. Thinner gate dielectric layers are also more susceptible to plasma-induced damage. Because gate dielectrics are increasingly being made thinner to accommodate shrinking integrated circuit geometries, plasma-induced damage to the gate dielectric is becoming an increasingly significant problem.

Plasma-induced damage of the gate dielectric can be avoided or reduced by keeping the semiconductor wafer and gate dielectric cool during plasma processing. The amount of current that flows through the gate dielectric during plasma processing, and hence the potential for damaging the gate dielectric can increase exponentially with temperature. Cooling the gate dielectric makes the gate dielectric more resistive to current flow. In addition, for a given current flow, the probability of creating damage in the dielectric decreases as temperature is reduced. Thus, using low process temperatures can reduce the amount of damage that occurs to the gate dielectric.

However, high process temperatures may be necessary to obtain the desired results for the particular plasma process being performed on the wafer. For example, in the deposition of silicon dioxide films, which are used as insulators in integrated circuit devices, film characteristics are improved by the use of high temperatures. These film characteristics include film composition, propensity for moisture absorption, film shrinkage upon thermal cycling, wet etch rate, and gap fill capability. Deterioration of these film characteristics can cause production problems and compromise the stability of the device. Thus, any improvements in device performance or yields that would be gained by using low process temperature to reduce plasma-induced damage to the gate dielectric could be lost by damage done to other parts of the device by not using high process temperatures.

Plasma-induced damage to the gate dielectric may also be reduced by limiting the exposure of the integrated circuit device to plasma during fabrication. Thus, exposing the integrated circuit device to plasma only during the plasma process, and not while transferring the semiconductor wafer into and out of the reaction chamber, can reduce damage to the gate dielectric.

There are, however, advantages to continuously maintaining a plasma condition in the reaction chamber, resulting in the semiconductor wafer being exposed to plasma during transfer. These advantages include maintaining uniform conditions in the chamber, which helps to prevent films deposited on the interior surfaces from flaking, and, hence, reduces the number of particulates that fall onto the semiconductor wafer and damage the device. Continuously maintaining a plasma condition within the chamber also increases throughput, as no time is required to stop and start plasma and bring the reaction chamber to the appropriate operating conditions. Thus, improvements in device performance and yield that could be obtained by not exposing the semiconductor wafer to plasma during device transfer are offset by the benefits of continuously maintaining a plasma condition.

SUMMARY

A method of performing plasma processes on semiconductor wafers having gate dielectric layers is provided that reduces the amount of plasma-induced damage to the gate dielectric. The method advantageously also reduces the number of particulates that fall onto the wafer from the chamber.

In the embodiments of the invention, a plasma is maintained in the reaction chamber throughout the process of transferring the wafer into the chamber, performing the plasma process, and removing the wafer from the reaction chamber. After performing the plasma process, the wafer, while still in the reaction chamber and under plasma conditions, is cooled to a removal temperature which is less than the process temperature used to perform the plasma process. Once the removal temperature is attained, the wafer is removed from the reaction chamber.

BRIEF DESCRIPTION OF THE FIGURES

The FIGURE is a flow chart illustrating a method for reducing plasma-induced damage to gate dielectrics.

DETAILED DESCRIPTION

Figure 1:
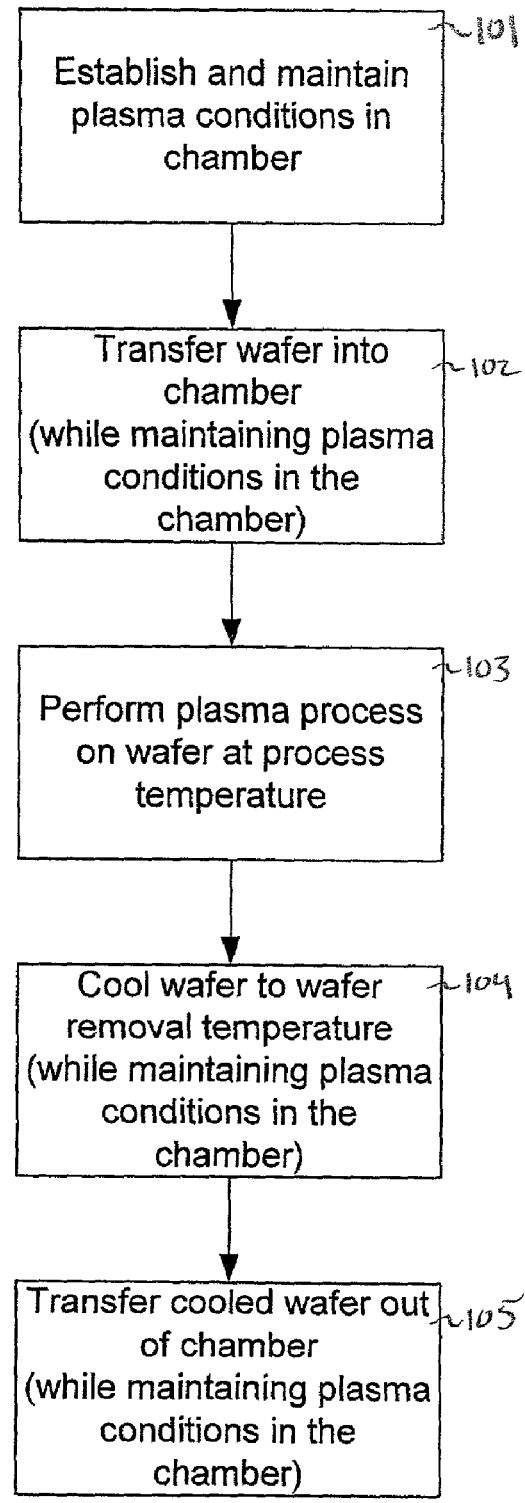

A plasma process method to reduce plasma-induced damage is illustrated in the diagram of the FIGURE. The process is performed on a semiconductor wafer. A gate dielectric layer, typically a silicon dioxide layer, and potentially other device and interconnect elements are formed on the wafer surface. The plasma process is performed in a reaction chamber in which plasma conditions are established and maintained, as indicated in block 101 of the FIGURE. The specific conditions of the plasma, referred to as an idle plasma when processing is not occurring, depend on the type of reaction chamber used and the particular plasma process to be performed, as understood by those of skill in the art. For example, in the deposition of silicon dioxide insulator, high density plasma (HDP) CVD reactors typically use an $O_2/Ar$ or $O_2/He$ gas mixture, at a ratio ranging from about 1:4 to 4:1, and a source RF power ranging from about 1800 W to 4500 W as an idle plasma condition. An exemplary idle plasma may use a source RF power of 3500 W and Ar and $O_2$ flow rates of 390 sccm and 150 sccm, respectively.

The wafer is transferred into the chamber while the plasma conditions are maintained, as indicated in block 102 of the FIGURE. The wafer is usually transferred into the reaction chamber by a standard wafer transfer robot that places the wafer on a platen within the chamber for processing. Once the wafer enters the reaction chamber, the wafer is exposed to plasma and plasma induced damage of the gate dielectric can occur. However, introducing the wafer into the reaction chamber at a low temperature can reduce the damage that occurs during this transfer to a negligible level. Thus, before transfer into the reaction chamber, the wafer is usually held at or cooled to a low temperature, usually below about 100° C., for example, room temperature, approximately 25° C. (or between about 15° C. and about 30° C.). A wafer transfer chamber, which is where the wafer is typically held before transfer into the reaction chamber, can be used to control the temperature of the wafer before it is transferred.

The plasma process is then performed, as indicated in block 103 of the FIGURE. The process typically includes a preheat step in which the wafer is heated to a preheat temperature at which the deposition or other process will start. Depending on the design of the chamber, the platen, plasma, or combination of platen and plasma, is used to heat the wafer to this preheat temperature. In HDPCVD reactors, plasma conditions are typically altered from the idle plasma for the preheat step. The RF power is usually raised and is typically in the range of about 2000 W to 5000 W. The length of time of the preheat step is typically in the range of 20 to 60 seconds. For example, a wafer may be heated to 300° C. in 30 seconds at 4000 W of source RF power.

When the preheat step is complete, the deposition or etch process is performed. The temperature at which the deposition or etch process is performed, referred to as the process temperature, will depend on the particular process, but is usually between about 300° C. and about 700° C. For some processes, the process temperature is maintained throughout the process and is the same as the preheat temperature. For other processes, the process temperature increases during the deposition or etch to above the preheat temperature.

Plasma conditions are generally altered from the preheat conditions to perform the deposition or etch process. For example, plasma deposition processes will generally involve introduction of a suitable process gas into the plasma, such as silane gas for silicon dioxide deposition. In HDPCVD reactors, a bias RF power, applied to the platen, of, e.g., 2500 W may be used. The source RF power is typically reduced to that of the idle plasma conditions. After the plasma process is finished, the plasma conditions are typically changed back to idle plasma conditions.

As indicated in block 104 of the FIGURE, once the plasma process is complete, the wafer is cooled to a wafer removal temperature. The wafer removal temperature is less than the process temperature, usually less than about 300° C., e.g., between about 80° C. and about 300° C. In some embodiments, e.g., for high process temperatures, the removal temperature is at least between about 100° C. to about 500° C. less than the process temperature. In one example, the process temperature is 350° C. and the removal temperature is 100° C. In general, the lower the removal temperature, the less damage that occurs to the gate dielectric.

The platen on which the wafer rests is usually used to cool the wafer, for example, with cooling gas supplied to the wafer for a period of time. Cooling is usually done quickly, e.g., for a period of from about 2 seconds to about 30 seconds, depending on the rate at which the platen can cool the semiconductor wafer and the degree of cooling that is required. The degree of cooling required depends on variables of the specific device being processed such as the gate oxide thickness, the gate oxide quality, and the overall process integration sequence, i.e., the amount of damage done to the gate oxide by other processes. In many instances it will be desired to cool the wafer to about 80° C., but in some cases a lesser degree of cooling may be dictated.

Because the wafer is exposed to plasma during the cooling period, plasma damage can occur to the oxide if the cooling period is too long. Generally, the lowest temperature to which the wafer can be cooled is limited by the cooling mechanism used to cool the wafer, which must cool the wafer while the wafer is still exposed to and being heated by the plasma. For example, in an HDPCVD reactor such as the Speed™ reactor of Novellus Systems, Inc. (San Jose, Calif.), the minimum achievable temperature is usually about 80° C. (although this depends, in part, on the temperature of the cooling water supplied to the platen). Thus, the wafer need not be exposed to the plasma for any time longer than that required to approach the minimum achievable temperature.

The cooled semiconductor wafer is then removed from the reaction chamber, as indicated in block 105 of the FIGURE. The plasma conditions continue to be maintained while the cooled wafer is transferred out of the chamber. A standard wafer transfer robot usually performs the transfer. Because the wafer is cooled, the exposure of the wafer to plasma while the wafer is being transferred out of the reaction chamber causes much less damage to the gate dielectric than would be the case if the cooling step of block 104 were not performed.

In a typical process cycle, the method, starting with block 102 of the FIGURE, is then repeated on another wafer. Typically, between 4 to 20 wafers, usually 10 wafers, are processed while still maintaining plasma conditions within the reaction chamber.

The method illustrated in the FIGURE is applicable to any plasma process, including, for example, etch of polysilicon to form the electrode over the gate dielectric, deposition and etch of metals and insulator materials in the formation of electric interconnects, and also to plasma cleaning and stripping processes. Exemplary processes include deposition of silicon dioxide, photoresist stripping, and platinum and cobalt silicide etch. As discussed above, maintaining plasma conditions within the reaction chamber while transferring, processing, cooling, and removing the wafer prevents flaking of deposits on the interior surface of the chamber and thus reduces the damage to the device resulting from particulates that fall onto the wafer.

The reaction chamber in which the method illustrated in the FIGURE is performed may be any reaction chamber in which a plasma process is performed. Deposition processes are typically performed in plasma CVD reactors, such as the HDPCVD Speed™ reactor of Novellus Systems. In HDPCVD reactors, a high density plasma, typically formed by electron cyclotron resonance (ECR) or as an inductively coupled plasma (ICP), is used. The high density plasma is used to heat the wafer to the process temperature. The platen, which is an electrostatic chuck, maintains the temperature of the wafer in the high density plasma during the plasma process by cooling the wafer, to prevent the wafer from going above the process temperature while being heated by the plasma. Helium gas is supplied to the gap between the top of the electrostatic chuck and the wafer to cool the wafer.

Plasma etch reactors in which the method illustrated in the FIGURE is typically performed include capacitively coupled parallel plate, ECR-HDP, ICP-HDP, or microwave powered reactors.

As mentioned above it may also be useful to perform the plasma process (block 103 of the FIGURE) at a process temperature that is lower than the conventional process temperature used. For example, in the formation of intermetal dielectrics, undoped silicate glass and fluorine doped silicon dioxide are typically deposited at process temperatures of 350° C. and 400° C., respectively. Lowering each of these process temperatures by about 50° C., to about 300° C. (between about 275° C. and about 325° C.) and about 350° C. (between about 325° C. and about 375° C.), respectively, can reduce the gate dielectric damage caused by the process during deposition of these films. Similarly, deposition of silicon dioxide for shallow trench isolation and deposition of phosphorous doped silicate glass are conventionally carried out at a process temperature of 650° C. The process temperature for these depositions may be reduced from 650° C. to between about 400° C. and about 550° C. to reduce the amount of damage to the gate dielectric. In lowering the process temperature, film quality must be optimized for gate dielectric damage.

In some cases, the wafer is transferred into the reaction chamber before the plasma is ignited. The plasma is ignited during the transfer or once the wafer is placed on the platen. In these cases, cooling the wafer before transfer into the chamber can reduce plasma damage during the plasma ignition. As described above, the wafer may be cooled to a low temperature, e.g., below 100° C., typically between 15° C. and 30° C. in a wafer transfer chamber. Similarly, the plasma may be extinguished before or while the wafer is being transferred out of the reactor and in these cases it may be beneficial to cool the wafer before the plasma is extinguished.

While particular embodiments of the present invention have been shown and described, it will be obvious to those skilled in the art that changes and modifications may be made without departing from this invention in its broader aspects. Therefore, the appended claims are to encompass within their scope all such changes and modifications as fall within the scope of this invention.

What is claimed is:

1. A method of processing a semiconductor wafer that reduces plasma-induced damage to a gate dielectric layer contained in the wafer, said method comprising creating a plasma in a reaction chamber and performing all of the following in the sequence indicated while maintaining said plasma in said reaction chamber:
    inserting the wafer into the reaction chamber, the wafer containing a gate dielectric layer;
    processing the wafer in the plasma;
    terminating the processing of the wafer;
    cooling the wafer to a removal temperature by using a coolant fluid; and
    removing the wafer from the reaction chamber;
    wherein no further processing of the wafer occurs between said cooling the wafer and said removing the wafer from the reaction chamber.

2. The method of claim 1, further comprising cooling the wafer to between about 15° C. and 30° C. before inserting the wafer into the reaction chamber.

3. The method of claim 1, wherein processing the wafer comprises the etching of photoresist.

4. The method of claim 1, wherein cooling the wafer lasts between about 2 seconds and about 30 seconds.

5. The method of claim 1, wherein cooling the wafer to a removal temperature comprises blowing a gas over the wafer.

6. The method of claim 1 wherein cooling the wafer comprises cooling a platen on which the wafer rests.

7. The method of claim 1, further comprising cooling the wafer before inserting the wafer into the reaction chamber.

8. The method of claim 1, wherein the wafer reaches a process temperature during processing and a removal temperature during removing, and wherein the removal temperature is at least between about 100° C. and about 500° C. below the process temperature.

9. The method of claim 1, wherein processing the wafer comprises the deposition of silicon dioxide.

10. The method of claim 1, wherein processing the wafer comprises the deposition of fluorine doped silicon dioxide.

11. The method of claim 1, wherein processing the wafer comprises the deposition of silicon dioxide for shallow trench isolation.

12. The method of claim 1, wherein processing the wafer comprises the deposition of phosphorus-doped silicon dioxide.

13. The method of claim 8, wherein the process temperature is greater than about 300° C. and the removal temperature is less than about 300° C.

14. The method of claim 8, wherein the removal temperature is between about 80° C. and about 300° C.

15. The method of claim 9, wherein the wafer reaches a temperature between about 275° C. and 325° C. during processing.

16. The method of claim 10, wherein the wafer reaches a temperature between about 325° C. and 375° C. during processing.

17. The method of claim 11, wherein the wafer reaches a temperature between about 400° C. and 550° C. during processing.

18. The method of claim 12, wherein the wafer reaches a temperature between about 400° C. and 550° C. during processing.

19. A method of processing a semiconductor wafer that reduces plasma-induced damage to a gate dielectric layer contained in the wafer, said method comprising creating a plasma in a reaction chamber and performing all of the following in the sequence indicated while maintaining said plasma in said reaction chamber:
    processing a wafer in the plasma, the wafer comprising a gate dielectric layer;
    terminating the processing of the wafer;
    cooling the wafer by using a coolant fluid; and
    removing the wafer from the reaction chamber;
    wherein no further processing of the wafer occurs between said cooling the wafer and said removing the wafer from the reaction chamber.

* * * * *